(12) United States Patent
Sharma

(10) Patent No.: US 12,393,350 B2
(45) Date of Patent: Aug. 19, 2025

(54) SSD-FORM-FACTOR MEMORY-EXPANSION CARTRIDGE WITH FIELD-REPLACEABLE DRAM MODULES

(71) Applicant: Astera Labs, Inc., Santa Clara, CA (US)

(72) Inventor: Avinash R. Sharma, San Francisco, CA (US)

(73) Assignee: Astera Labs, Inc., San Jose, CA (US)

( * ) Notice: Subject to any disclaimer, the term of this patent is extended or adjusted under 35 U.S.C. 154(b) by 296 days.

(21) Appl. No.: 18/127,643

(22) Filed: Mar. 28, 2023

(65) Prior Publication Data

US 2024/0329854 A1 Oct. 3, 2024

(51) Int. Cl.
*G06F 3/06* (2006.01)
*G06F 13/40* (2006.01)
*G06F 13/42* (2006.01)

(52) U.S. Cl.
CPC .......... *G06F 3/0619* (2013.01); *G06F 3/0653* (2013.01); *G06F 3/0673* (2013.01); *G06F 13/4068* (2013.01); *G06F 13/4221* (2013.01); *G06F 2213/0026* (2013.01)

(58) Field of Classification Search
None
See application file for complete search history.

(56) References Cited

U.S. PATENT DOCUMENTS

2022/0107733 A1* 4/2022 Trika .................... G06F 3/0607

OTHER PUBLICATIONS

Hands, Jonmichael, "EDSFF—A Dynamic Family of Form Factors for Data Center SSDs," OCP Global Summit, San Jose, CA, Mar. 4-5, 2020, 13 pages.
Lynn et al., "Introducing the EDSFF E3 Family of Form Factors," KIOXIA White Paper, Nov. 2022, v. 3.0, 7 pages.
Storage Networking Industry Association (SNIA), "SFF-TA-1008 Specification for Enterprise and Datacenter Device Form Factor (E3)," Revision 2.0, Nov. 6, 2020, 27 pages.

* cited by examiner

*Primary Examiner* — Scott C Sun
(74) *Attorney, Agent, or Firm* — Charles Shemwell

(57) ABSTRACT

A hot-swappable DRAM cartridge implemented in a standards-compliant SSD form-factor has an access panel that opens to enable removal and insertion of socketed DRAM memory modules. In at least some implementations, the DRAM cartridge complies with form-factor, protocol, connector, and pin-out/signal specifications set forth in one or more Enterprise and Data Center Standard Form Factor (EDSFF) specifications promulgated by Storage Networking Industry Association (SNIA) including, for example and without limitation, form-factor specifications set forth in EDSFF standards E3.S, E3.S 2T, E3.L and E3.L 2T.

15 Claims, 3 Drawing Sheets

SSD-FORM-FACTOR MEMORY-EXPANSION CARTRIDGE WITH FIELD-REPLACEABLE DRAM MODULES

TECHNICAL FIELD

Figure 1:
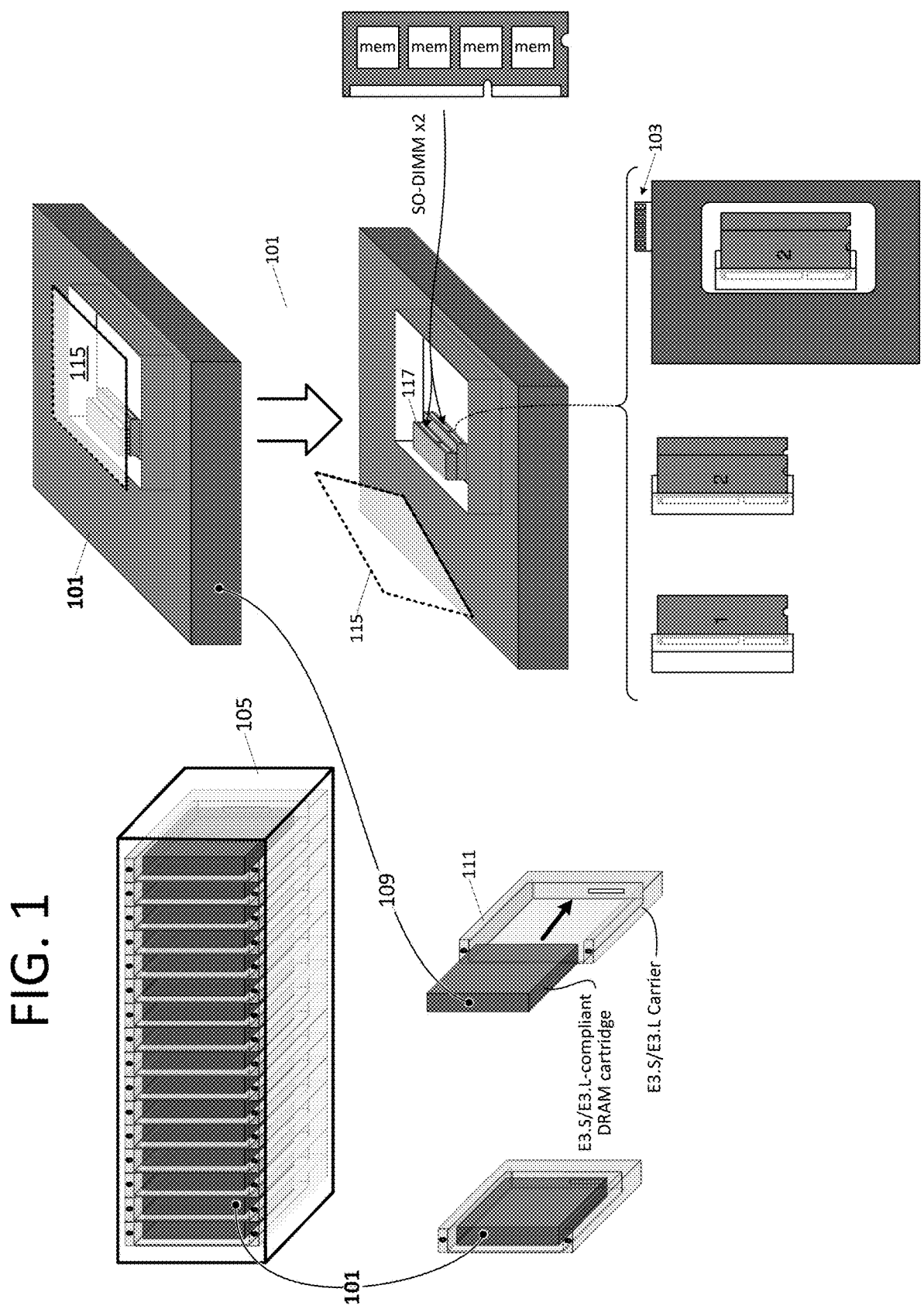

The disclosure herein relates to non-persistent storage systems and more particularly to dynamic random access memory (DRAM) systems.

DRAWINGS

Figure 2:
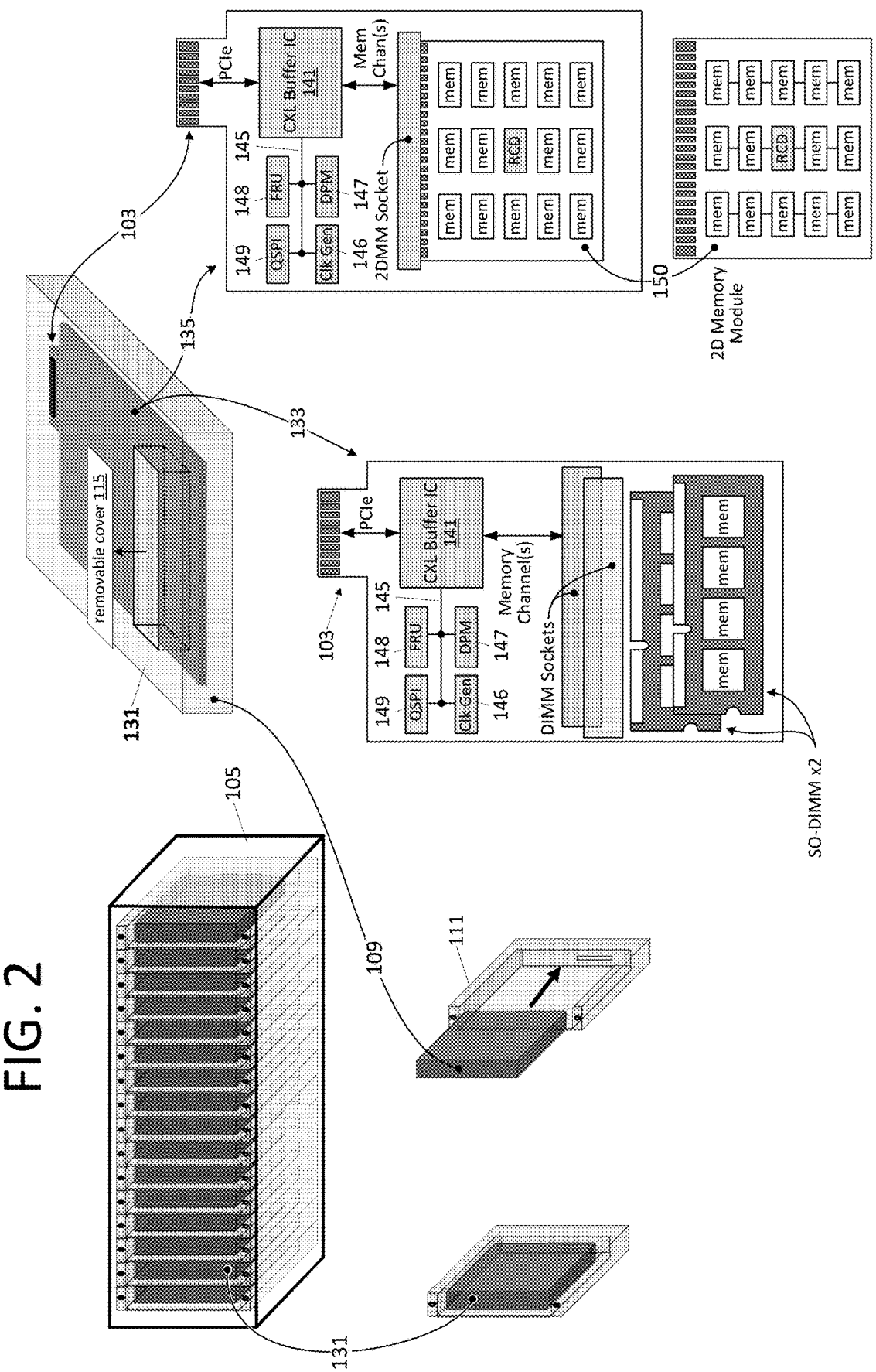
Figure 3:
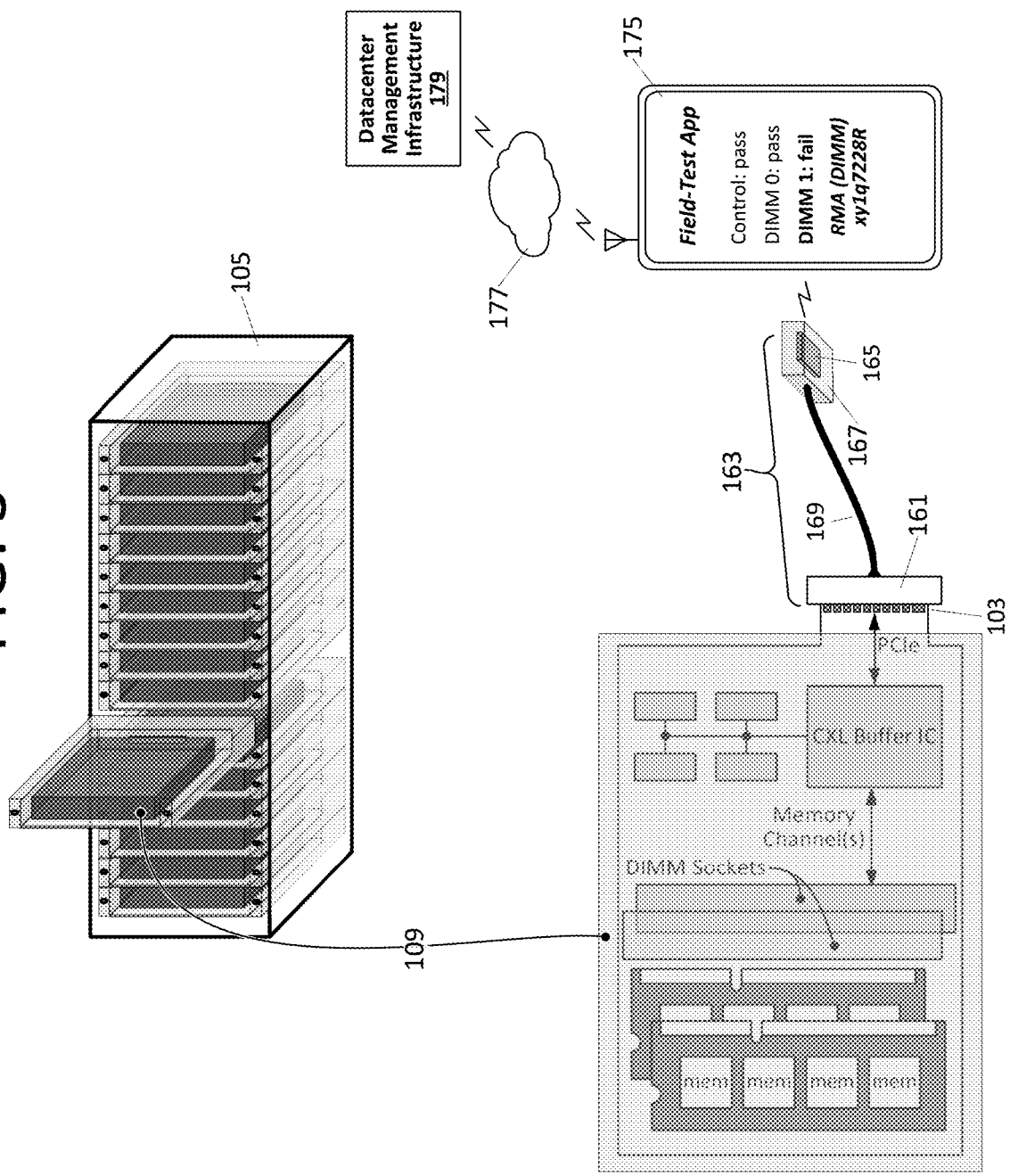

The various embodiments disclosed herein are illustrated by way of example, and not by way of limitation, in the figures of the accompanying drawings and in which like reference numerals refer to similar elements and in which:

FIG. 1 illustrates an embodiment of a field-serviceable DRAM cartridge having an industry-standard solid-state drive (SSD) form-factor and an industry-standard signal/pin-out/connector interface to enable the DRAM cartridge to be removed from or inserted into a continuously powered data center server-computer rack;

FIG. 2 illustrates an alternative SSD-form-factor-compliant, field-serviceable DRAM cartridge showing additional detail with respect to components mounted to cartridge baseboards; and FIG. 3 illustrates an exemplary hot-extraction of a DRAM cartridge (i.e., removal from server-computer rack while under power) and insertion of the edge connector thereof into the connector-socket of a field-test unit.

DETAILED DESCRIPTION

In various embodiments herein, a hot-swappable DRAM cartridge implemented in a standards-compliant SSD form-factor has an access panel that opens to enable removal and insertion of socketed DRAM memory modules. In a number of embodiments, the DRAM cartridge is implemented in compliance with form-factor, protocol, connector, and pin-out/signal specifications set forth in one or more Enterprise and Data Center Standard Form Factor (EDSFF) specifications promulgated by Storage Networking Industry Association (SNIA) including, for example and without limitation, form-factor specifications set forth in EDSFF standards E3.S, E3.S 2T, E3.L and E3.L 2T. In those and other embodiments, the DRAM cartridge houses, together with the socketed DRAM memory modules, a memory-buffer integrated circuit that communicates with a host computing device via a cache-coherent/memory-semantic signaling protocol built over a PCIe-compliant physical signaling layer (compliant with one or more Peripheral Component Interconnect Express standard specifications). By this arrangement, the DRAM cartridge appears, from the perspective of a host device (e.g., root complex coupled to PCIe link), to be a JEDEC-memory-standard-compliant DRAM installation (i.e., compliant with Joint Electron Device Engineering Council SDR, DDR2, DDR3, DDR4, DDR5, DDR6, etc.), and yet with (i) hot-swappable connection and disconnection of the cartridge to the backplane or other connector within a host computing device (i.e., installation or removal of cartridge without powering off host computing device, (ii) expandable memory capacity through post-deployment DRAM module insertion (via access panel) and (iii) field-serviceability (removal/insertion via access panel). In yet other embodiments, a field tester unit (FTU) may be coupled to the socket connector of a hot-extracted DRAM cartridge (e.g., extracted from powered backplane of a data-center server rack) to enable device testing—confirming device operability or, conversely, identifying one or more failed components on the DRAM cartridge, including identifying one or more failed DRAM memory modules that may be in-field replaced.

FIG. 1 illustrates an embodiment of a field-serviceable DRAM cartridge 101 having a form-factor compliant with the EDSFF E3.S or E3.L SSD standards and PCIe-compliant signal/pin-out interface (terminating in edge connector 103) to enable the DRAM cartridge to be removed from or inserted into a continuously powered data center server-computer rack 105 (i.e., DRAM cartridge 101 may be inserted into or extracted from backplane connector of server rack while backplane is under power and thus "hot-swappable"). Edge connector 103 is constituted by terminals of signal traces coupled to a buffer integrated circuit (e.g., implemented by an application-specific integrated circuit (ASIC) not specifically shown in FIG. 1) having a PCIe-compliant physical signaling interface (PHY) and circuitry compliant with one or more cache-coherent/memory-semantic communication protocols (i.e., receiving and responding to standardized memory read and write requests) layered over the PCIe PHY, including for example and without limitation, the Compute Express Link (CXL), Gen-Z and/or OpenCAPI protocols. By this arrangement, DRAM cartridge 101 appears to one or more processors installed within and/or electrically connected to the server rack (e.g., via intra-datacenter network, Internet, or other wide-area or local-area network) as a conventional DRAM memory controller having one or more JEDEC-compliant DRAM DIMMs (dual-inline memory modules) coupled thereto. Accordingly, the form-factor and memory-semantic-protocol of the DRAM cartridge enable virtually unlimited DRAM capacity expansion (e.g., server rack and other similar server racks within a data center may be populated with any number of DRAM cartridges 101 up to and including the entirety of each rack instance), while the PCIe PHY enables the DRAM cartridge to be installed and removed under power. Moreover, as illustrated by the rack-extracted instance at 109 (the E3.S/E3.L form-factor of the DRAM cartridge enables installation within the server rack via a E3-compliant carrier 111), DRAM cartridge 101 includes a service panel 115 that opens (e.g., mechanically swung open or lifted away/removed altogether) to expose one or more JEDEC-compliant DIMM sockets 117 and thus enable DRAM-bearing DIMMs to be serviced in the field-supplementing the cartridge storage capacity (i.e., by adding an extra DRAM DIMM into an unpopulated socket and/or replacing a resident DIMM with a higher-capacity DIMM) and/or replacing one or more failed DIMMs as discussed below. In the specific example shown, the DIMM sockets are mounted to a printed circuit board (PCB)—the cartridge "baseboard"—disposed predominantly within the cartridge housing (i.e., such that substrates of socketed DIMMs are parallel to the cartridge baseboard) and thus in a low-profile orientation that enables DIMM population within an enclosure compliant with the ES.3 or ES.3 2T (or E3.L or E3.L 2T) EDSFF standards. In the FIG. 1 embodiment, two small-outline DIMM sockets 117 (i.e., "SO-DIMM" sockets) are accessible via the service aperture (i.e., opening effected by removal of panel 115), though more or fewer DIMM sockets having any number of socket form-factors and electrical pin-outs (including a diversity of different DIMM connectors and/or proprietary form-factor/electrical specification) may be deployed within DRAM cartridge 101 in alternative embodiments.

FIG. 2 illustrates an alternative EDSFF-compliant, field-serviceable DRAM cartridge 131 (e.g., having one or more memory-module sockets rotated 90° from those shown in FIG. 1—as shown in exemplary detail views 133 and 135 alternative cartridge baseboard embodiments—such that DIMM connectors are parallel, rather than orthogonal to, DRAM cartridge connector 103), in this instance showing additional detail with respect to components mounted to cartridge baseboards 133/135. In the depicted examples, a baseboard-mounted CXL buffer IC 141 includes a PCIe interface coupled to PCB backplane connector 103 (i.e., cartridge connector or baseboard connector) and one or more JEDEC-compliant memory channels coupled to memory-module socket(s) and thus to any socketed DIMMs. CXL buffer IC 141 (so-named herein due to the buffer IC's support for CXL-compliant signaling over the PCIe link, though the buffer IC may support standardized and/or proprietary memory-semantic/cache-coherent communication protocols other than or in addition to CXL in alternative embodiments (e.g., Gen-Z, OpenCAPI, etc.)) is coupled via one or more internal signaling paths 145 (only one of which is shown) to various supporting components including, for example and without limitation, a timing signal IC 146 (e.g., crystal oscillator or MEMS oscillator and supporting circuitry), digital power management IC 147, field replacement unit 148, non-volatile storage 149 (in the depicted example, for instance, a flash memory having a quad serial programmable interface (QSPI)), etc. Various additional/alternative components may be mounted to the cartridge baseboard and interconnected to buffer IC 141 and/or other cartridge-resident components in other embodiments including, for example and without limitation, one or more retimer ICs, re-driver ICs, clock buffers, FPGAs, CPLDs, volatile and/or nonvolatile memory components (e.g., static random access memory, dynamic random access memory, flash memory, read only memory (ROM), electrically-erasable programmable ROM (EEPROM)), and/or any other integrated-circuit and/or discrete components that may be deployed to support/supplement DRAM cartridge operation. In alternative embodiments, the CXL buffer IC and/or other components may be disposed on a face/surface of the cartridge baseboard opposite the DRAM sockets, thus providing room for additional DRAM DIMM sockets—for example, two additional SO-DIMM sockets disposed back to back with those shown (i.e., such that two pairs of SO-DIMMs may be installed, with one pair socket-inserted in a direction opposite the other)—with all DIMM sockets accessible via a single removable/open-able service panel (enlarged relative to that shown), via respective per-DIMM-pair service panels, etc.

As mentioned above, the various DRAM cartridge embodiments presented herein may support DRAM-bearing memory modules having standardized or proprietary form factors (and electrical interfaces) other than those of JEDEC-compliant DIMMs. FIG. 2 illustrates an example of one-such DRAM module at 150, in this case having a two-dimensional array of DRAM memory components disposed about a central registered clock driver (RCD) and removably inserted within a two-dimensional memory-module (2DMM) socket on baseboard 135. The 2DMM socket (e.g., soldered to traces on the DRAM cartridge baseboard) is coupled to buffer IC 141 via one or more JEDEC-compliant or proprietary memory channels. In alternative embodiments, buffer IC 141 and/or supporting components may be disposed on a backside of cartridge baseboard 135, thus making room for an additional 2DMM socket. Also, while a single 2DMM socket (and a single 2D memory module) is depicted, a stacked and laterally staggered pair (or more than two) of those sockets may be implemented on either or both sides of the cartridge baseboard in alternative embodiments to enable installation of two or more 2D memory modules within the host DRAM cartridge. More generally, in all embodiments herein, memory module sockets (or groups of two or more thereof) may be disposed on both surfaces of the cartridge baseboard, space permitting (e.g., within EDSFF-compliant enclosures having double-thickness such as E3.S 2T or E3.L 2T). Also, though not specifically shown, JEDEC-compliant memory modules and/or proprietary memory modules may include one or more data buffer ICs coupled between data interfaces of individual memory devices (or groups thereof) and corresponding data interface(s) of CXL buffer IC 141 (i.e., situated within the data path of each or any of the memory channels).

FIG. 3 illustrates an exemplary hot-extraction of a DRAM cartridge (i.e., removal from rack 105 while under power) and insertion of the edge connector thereof (103) into the connector-socket 161 of a field-test unit 163. In the depicted example, test unit 163 includes an encased control ASIC 165 (i.e., with enclosure 167) having a PCIe interface to issue DRAM read/write commands (as well as any host-level maintenance and/or configuration commands—e.g., the latter to set open-page/closed-page operating policies, enable/disable data encryption, etc.) to DRAM cartridge 109—in this instance via cable 169 and connector 161—as necessary to confirm correct functioning of any and all DRAM modules socketed within the DRAM cartridge 109 as well as the DIMM interface circuitry (i.e., CXL buffer IC and/or supporting IC components as discussed above). Tester unit 163 also includes a wireless interface (e.g., in compliance with a Bluetooth, Near-Field Communication (NFC), WIFI or other wireless communication standard) that enables wireless communication with a counterpart wireless interface within a handheld or portable computing device—a smartphone 175 executing a tester-readout application ("app") in this example, to render status/health information pertaining to the DRAM cartridge onto the smartphone display. Through this arrangement, a service technician may hot-extract a DRAM cartridge from host server rack 105 (e.g., within a data center), plug the DRAM cartridge into the tester 13, and then commence operational/memory testing (e.g., through execution of an application program within the smartphone, laptop computer, dedicated tester appliance, etc.) to yield a readout indicating pass/fail status of the DRAM cartridge as a whole as well as individual DRAM modules socketed therein. In the depicted example, the field-test application determines (and displays information to the service technician indicating) that the control circuitry within the DRAM cartridge (i.e., "control" including, for example, the CXL buffer IC and other components hard-soldered to the cartridge baseboard) and DRAM DIMM installed in socket 0 are functioning correctly, and that failure was detected within the DRAM DIMM installed in socket 1. The tester app may communicate via the Internet or other communications network (shown conceptually at 177) with a remote datacenter management installation/infrastructure 179, the latter gathering statistics and/or other information regarding the failed DIMM (e.g., nature of failure, manufacturer, suspect component types, etc.) and/or providing return materials authorization (RMA) information to the field service technician. More specifically with regard to the DIMM 1 failure scenario, the service technician may open/remove the service panel on the DRAM cartridge to expose the DIMM installation, remove the suspect/failed DIMM reported by the field-test app (i.e., failed DIMM 1 in this example), insert a replacement DIMM into the now-empty DIMM socket, re-test the DRAM cartridge via the field-test app to confirm proper functioning and, upon receiving that confirmation, re-install/close the service panel (to re-seal the chamber in which the DRAM modules are socketed) and finally hot-insert DRAM cartridge 109 into server rack 105. RMA information returned from the data-center management infrastructure may optionally be printed onto a shipping label (i.e., via communication from the tester app or other compute application to a printing device) in the form of a bar code, quick-response (QR) code, etc. (optionally together with a human-readable character sequence), and the label applied to a shipping package to facilitate delivery of the failed DRAM module to a remote service center. In some failure modes, the field-test app may indicate (itself or by virtue of instruction/communication from the support compute infrastructure) that the failed DRAM module is to be discarded rather than shipped for evaluation/repair. Also, in alternative embodiments, the DRAM cartridge itself may be implemented with wireless communication (or have a physical service port accessible while the DRAM cartridge is installed within server rack 105) and instructed to execute various tests without removal from the server rack-instruction issued by authenticated service device (e.g., authenticated app executed within handheld computing device) and test results returned wirelessly to that same device for presentation to a user. In yet other embodiments, tests may be initiated in response to instructions issued by a host computer via the PCIe port of the DRAM cartridge, with results returned to one or more local or remote computing devices operated by data-center management personnel (e.g., returned to user via Internet, intranet, or other digital communications network). One or more lighting elements (e.g., light-emitting diodes) and/or speaker elements may be provided to signal device status, including errors/operational failure detected with respect to one or more socketed DRAM modules.

Referring to FIGS. 1-3 generally, the various DRAM cartridges disclosed herein may be implemented in accordance with alternative form-factor and/or electrical-interconnect standards (e.g., E1.S and E1.L EDSFF standards promulgated by SNIA), and the various socketed memory modules may likewise be implemented in accordance with various standards (e.g., high-bandwidth memory module implemented as a die stack with or without a base layer die). Also, memory subsystem architectures other than those shown and described in reference to FIG. 2 may be implemented on the baseboard of a given DRAM cartridge and, however implemented, and two or more such cartridge baseboards and associated memory subsystems may be implemented within a DRAM cartridge (e.g., within an E3.S 2T or E3.L 2T form-factor cartridge in particular). Individual memory components mounted to or within a given memory module may include a single memory die or multiple stacked and/or laterally disposed memory dies). Additionally, hardware-level implementations of any or all of the various DRAM cartridges (and/or supporting circuitry therein) may be described using computer aided design tools and expressed (or represented), as data and/or instructions embodied in various computer-readable media, in terms of their physical, behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details not required to practice those embodiments. For example, various interconnections between internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device or register "programming" can include, for example and without limitation, loading a control value into a configuration register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operational aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A hot-swappable memory cartridge comprising:
a printed circuit board having an integral edge connector compliant with a peripheral-component interconnect express (PCIe) signaling standard;
one or more memory module sockets secured to the printed circuit board, each memory module socket having an electrical connector to receive a counterpart edge connector of a respective dynamic random access memory (DRAM) module such that one or more DRAM modules may be removably inserted into the one or more memory module sockets; and
a cartridge enclosure compliant with a standard-specified solid-state-drive (SSD) form-factor and having:
an opening through which the integral edge connector of the printed circuit board extends to enable the hot-swappable memory cartridge to be plugged into the backplane of a rack-mount computing enclosure;
an access panel that may be moved from a shut position to expose the one or memory module sockets.

2. The hot-swappable memory cartridge of claim 1 further comprising an application-specific integrated circuit (ASIC) disposed on the printed circuit board and electrically coupled between the PCIe-compliant edge connector and the one or more memory module sockets.

3. The hot-swappable memory cartridge of claim 1 wherein the ASIC comprises circuitry to implement, over the PCIe physical signaling interface, a cache-coherent signaling protocol that supports memory read and write semantics.

4. The hot-swappable memory cartridge of claim 3 wherein the ASIC to implement the cache-coherent signaling protocol comprises circuitry to implement the cache-coherent signaling protocol in compliance with one or more Compute Express Link (CXL) standards specifications.

5. The hot-swappable memory cartridge of claim 1 wherein the respective DRAM module comprises a dual inline memory module (DIMM) substrate having DRAM components disposed on each face thereof and coupled via respective sets of data lines to the edge connector of the DRAM module.

6. The hot-swappable memory cartridge of claim 1 wherein the respective DRAM module comprises a signaling interface in accordance one or more memory interface standards promulgated by the Joint Electron Device Engineering Council (JEDEC).

7. The hot-swappable memory cartridge of claim 1 wherein the access panel fully detaches from the cartridge enclosure to expose the one or more memory module sockets.

8. The hot-swappable memory cartridge of claim 1 wherein, when moved from the shut position, the access panel exposes an aperture through which the one or more DRAM modules may be inserted into the one or more memory module sockets.

9. The hot-swappable memory cartridge of claim 8 wherein, when moved from the shut position, the access panel pivots about one or more hinges disposed at an edge of the aperture to expose the one or more memory module sockets.

10. The hot-swappable memory cartridge of claim 8 wherein the aperture and access panel are sufficiently large to enable a standard small-outline dual inline memory module (standard SO-DIMM) to enter the enclosure for insertion within any one of the one or more memory module sockets.

11. The hot-swappable memory cartridge of claim 8 wherein the aperture is formed within a first surface of the enclosure and is covered by the access panel in the shut position, and wherein, when moved from the shut position, the access panel slides in a direction parallel to the first surface.

12. The hot-swappable memory cartridge of claim 1 wherein the one or more memory module sockets comply physically and electrically with a small-outline DIMM (SO-DIMM) standard specification.

13. The hot-swappable memory cartridge of claim 1 wherein the cartridge enclosure complies with an Enterprise and Datacenter Standard Form Factor (EDSFF) specification promulgated by the Storage Networking Industry Association (SNIA).

14. The hot-swappable memory cartridge of claim 1 wherein the cartridge enclosure complies with at least one of the following EDSFF specifications: E3.S; E3.S 2T; E3.L; or E3.L 2T.

15. The hot-swappable memory cartridge of claim 1 wherein the cartridge enclosure comprises a dimensional outline that enables the enclosure to be secured within an SSD carrier structure having a standards-compliant form-factor and that facilitates plugging the hot-swappable memory cartridge into the backplane of the rack-mount computing enclosure and extraction of the hot-swappable memory cartridge from the backplane of the rack-mount computing enclosure.

* * * * *